US008717745B2

(12) United States Patent
Frigiere et al.

(10) Patent No.: US 8,717,745 B2

(45) Date of Patent: May 6, 2014

(54) COOLING METHOD FOR COOLING MEDIUM-VOLTAGE ELECTRICAL SWITCHGEAR USING INTEGRATED HEAT PIPES, AND A SYSTEM USING SAID METHOD

(75) Inventors: Denis Frigiere, Decines (FR); Didier Rodrigues, Serpaize (FR); Jean-Marc Willieme, La Mulatiere (FR); Frank Jacquier, Mions (FR)

(73) Assignee: Alstom Technology Ltd, Baden (CH)

(*) Notice: Subject to any disclaimer, the term of this patent is extended or adjusted under 35 U.S.C. 154(b) by 121 days.

(21) Appl. No.: 13/502,440

(22) PCT Filed: Oct. 25, 2010

(86) PCT No.: PCT/EP2010/066017

§ 371 (c)(1), (2), (4) Date: Apr. 17, 2012

(87) PCT Pub. No.: WO2011/051202

PCT Pub. Date: May 5, 2011

(65) Prior Publication Data

US 2012/0206863 A1 Aug. 16, 2012

(30) Foreign Application Priority Data

Oct. 26, 2009 (FR) ..................................... 09 57484

(51) Int. Cl.

*H05K 7/20* (2006.01)

*H02B 5/00* (2006.01)

(52) U.S. Cl.

USPC ................. 361/677; 361/679.46; 361/679.52; 361/605; 361/689; 361/700; 361/701; 165/104.19; 165/104.21; 165/104.26; 165/104.33; 174/15.1; 174/15.2; 174/15.3; 174/16.3; 200/289

(58) Field of Classification Search

USPC ................. 361/115, 600, 605, 611, 634, 637, 361/641–648, 677, 688, 689, 700, 701; 165/104.14, 104.33, 104.34, 185; 174/15.1–15.3, 16.3, 50.02, 70 B, 71 B, 174/72 B, 88 B, 99 B; 29/592, 592.1, 890.03; 200/289; 218/118, 144 B, 157

See application file for complete search history.

(56) References Cited

U.S. PATENT DOCUMENTS 3,212,544 A * 10/1965 Cantoni ......................... 99/485
3,662,137 A 5/1972 Cleaveland (Continued)

FOREIGN PATENT DOCUMENTS

DE 39 41 388 A1 6/1991
EP 1 657 731 A1 5/2006

OTHER PUBLICATIONS

International Search Report issued on Jan. 18, 2011, in PCT/EP2010/066017 (2 pgs.).

(Continued)

*Primary Examiner* — Michail V Datskovskiy

(74) *Attorney, Agent, or Firm* — Oblon, Spivak, McClelland, Maier & Neustadt, L.L.P.

(57) ABSTRACT

The method of the invention makes it possible to cool electrical switchgear operating at medium voltage and high current, such as a circuit breaker. The method consists in inserting serially two heat pipes (11) inside said switchgear, putting a first end (11A) of the first heat pipe (11) in the hot portion of the hot portions (10A, 10C) of the circuit breaker (10) and a second end (11B) of the first heat pipe (11) in a portion that is cooler (10A) of the hot portions (10A, 10C). The other heat pipe (11) is put between the cooler of the hot portions (10A) and a cooler part of the circuit breaker (10). A particular application is provided for medium-voltage, high-current circuit breakers.

2 Claims, 2 Drawing Sheets

(56) References Cited

U.S. PATENT DOCUMENTS

Figure 1:
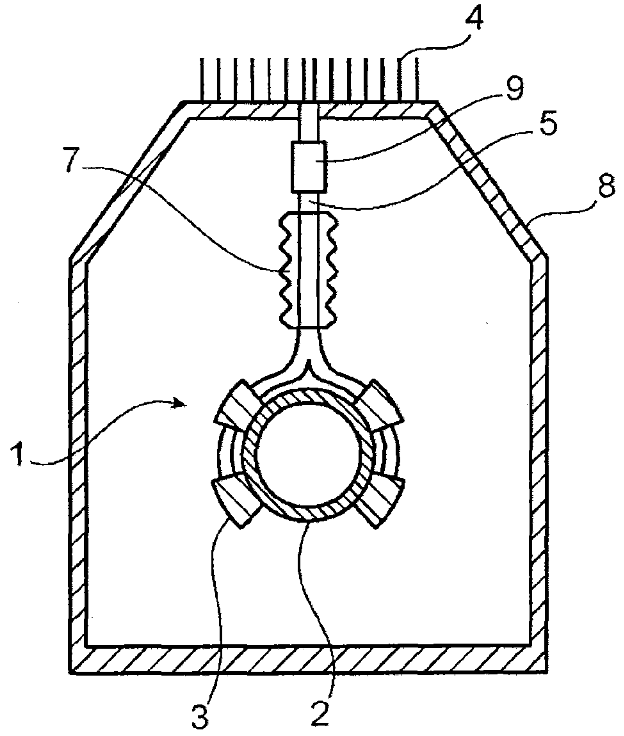
FIG. 1 Prior Art

| | | | | | |
|---|---|---|---|---|---|
| 3,711,622 | A | * | 1/1973 | Deno | 174/360 |
| 3,761,599 | A | * | 9/1973 | Beatty | 174/15.2 |
| 3,764,765 | A | * | 10/1973 | Olashaw | 200/289 |
| 3,767,835 | A | * | 10/1973 | Engelhardt | 174/11 BH |
| 3,769,551 | A | * | 10/1973 | Corman et al. | 361/676 |
| 3,778,680 | A | * | 12/1973 | Vaneerden | 361/689 |
| 4,005,297 | A | * | 1/1977 | Cleaveland | 218/118 |
| 4,123,618 | A | * | 10/1978 | Cushing et al. | 174/11 BH |
| 7,038,912 | B2 | * | 5/2006 | Pleines et al. | 361/704 |
| 7,253,379 | B2 | * | 8/2007 | Lakner et al. | 219/494 |
| 7,272,003 | B2 | * | 9/2007 | Pleines et al. | 361/690 |
| 7,471,495 | B2 | * | 12/2008 | Steffens et al. | 361/115 |
| 7,557,295 | B2 | * | 7/2009 | Kiefer et al. | 174/15.1 |
| 7,771,114 | B2 | * | 8/2010 | Kiefer et al. | 374/152 |
| 7,881,033 | B2 | * | 2/2011 | Chartouni et al. | 361/115 |
| 8,081,464 | B2 | * | 12/2011 | Mauroux et al. | 361/703 |
| 8,169,775 | B2 | * | 5/2012 | Bortoli et al. | 361/677 |
| 8,278,582 | B2 | * | 10/2012 | Tu et al. | 218/118 |
| 8,426,730 | B2 | * | 4/2013 | Widmer et al. | 174/15.5 |
| 2006/0102618 | A1 | | 5/2006 | Lakner et al. | |
| 2007/0209790 | A1 | | 9/2007 | Kiefer et al. | |

OTHER PUBLICATIONS

U.S. Appl. No. 13/502,421, filed Apr. 17, 2012, Frigiere, et al.
U.S. Appl. No. 13/502,414, filed Apr. 17, 2012, Frigiere, et al.

* cited by examiner

COOLING METHOD FOR COOLING MEDIUM-VOLTAGE ELECTRICAL SWITCHGEAR USING INTEGRATED HEAT PIPES, AND A SYSTEM USING SAID METHOD

FIELD OF THE INVENTION AND DEFINITION

The invention relates in particular to the field of circuit breakers or disconnectors for medium-voltage generators, placed in a protective sheath, and using cooling devices called "heat pipes" that operate with a phase-change heat-transfer fluid.

It should be recalled that a heat pipe is presented in the form of a long hermetically-sealed enclosure containing a fluid with its gaseous phase and its liquid phase in equilibrium, in the absence of any other gas.

PRIOR ART AND PROBLEM POSED

The constant concern of makers of that type of equipment is to increase the ability of such gear to conduct higher and higher currents, in particular for circuit breakers and disconnectors placed inside busbars at the outlets of power stations for producing or distributing electricity. That applies particularly for alternator circuit breakers.

A method that is generally used consists in making more uniform the temperature of the air that is in contact with the various heating and heated parts of the circuit breaker concerned. The cooling inside such a protective sheath may take place by natural or forced convection of the air enclosed therein and in which the circuit breaker is to be found, the prevailing temperature inside the protective sheath being considerably higher than the prevailing temperature outside, by 30° C. to at least 40° C.

Another solution consists in providing an increase in the current flow section in the various transmission elements, and thus increasing the size of circuit breaker parts.

A third solution consists in cooling the switchgear itself. Patent document EP 1 657 731 describes a known cooling device and method for cooling a high-voltage disconnector or a circuit breaker. FIG. 1 shows, in section, an embodiment described in that document. FIG. 1 mainly shows a high-voltage conductor or the casing of a circuit breaker. It is surrounded by evaporators 3 forming part of a cooling assembly 1 therefor. Such an assembly is accompanied by an insulating sleeve 7 surrounding a device operating with a phase-change heat-transfer fluid 5 in order to evacuate the heat collected by the evaporators 3. A flexible sleeve 9 completes the assembly. The various parts are placed together inside a protective sheath 8. The cooling assembly opens out to the top of this protective sheath 8 leading to a condensation device 4, e.g. with fins.

The object of the invention is to propose a different solution for cooling switchgear.

It is stated that present standards require the temperatures of contacts and switchgear forming part of high-voltage, high-current electrical installations to be less than 105° C., thereby limiting the current that can be conveyed by the switchgear under consideration.

SUMMARY OF THE INVENTION

To this end, the invention mainly provides a cooling method for cooling medium-voltage, high-current switchgear, having hot portions a hot portion of which is hotter than the other hot portion and portions that are cooler than the hot portions.

In the invention, this method consists in inserting two heat pipes serially inside the switchgear, putting a heat pipe between the hot portions in order to evacuate the heat from the hotter towards the cooler of the two hot portions, and putting a first end of another heat pipe in the cooler portion of the hot portions and a second end of this other heat pipe in a less hot portion than the hot portions. It is thus possible to extract the heat prevailing in the particularly hot portions and therefore to make the temperature in the switchgear more uniform.

Another main aspect of the invention is a cooling system for cooling medium-voltage, high-current electrical switchgear, of the circuit breaker or disconnector type, having hot portions, a hot portion of which is hotter than the other hot portion and portions that are cooler than the hot portions.

In the invention, the system has a first heat pipe between the hot portions and another heat pipe, a first end of which is placed in the less hot portion of the hot portions and a second end is placed in a portion that is cooler, the two heat piper being serially set.

LIST OF FIGURES

Figure 2:
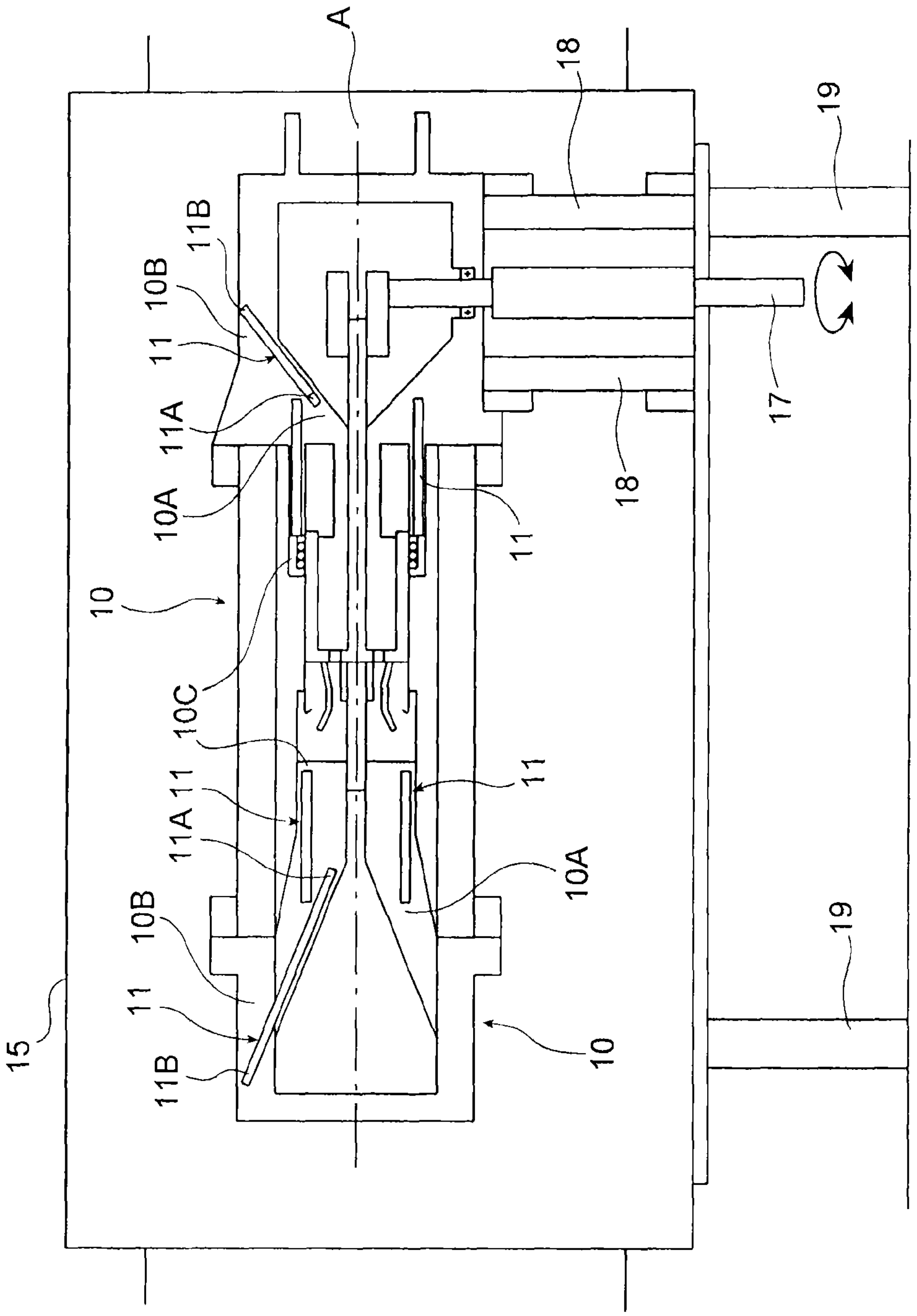

The invention and its various technical characteristics can be better understood on reading the following description of an embodiment of the invention. The description is accompanied by two figures in which, respectively:

FIG. 1, described above, is a cross-section showing a prior art cooling system for cooling medium-voltage high-current switchgear; and FIG. 2 is a longitudinal section showing an embodiment of a system of the invention.

DETAILED DESCRIPTION OF AN EMBODIMENT OF THE INVENTION

FIG. 2 shows high-voltage switchgear operating at high current, such as a circuit breaker 10. Said circuit breaker is placed inside a sheath 15, on insulating supports 18. Control elements 17 are shown in FIG. 2, in particular on the outside of the sheath 15. The sheath is thus placed on the supports 19.

The circuit breaker 10 has stationary portions and movable portions. Among these portions there are portions or parts of thickness that is non-negligible.

In addition, some of these parts or portions have hot portions 10C and 10A, in particular the center of the circuit breaker 10. It is stated that the hot portions 10C are hotter than the hot portions 10A that are in the region of the contacts of the circuit breaker 10. However, said circuit breaker also has cooler portions 10B, which are therefore cooler than the hot portions 10A and 10C, and which are placed off-center relative to the center of the circuit breaker, which is marked by an axis A. It should be noted that other cooler portions may be situated towards the center of the circuit breaker 10, providing they are distanced by passing contacts of the rated current.

It may this be understood that part of the heat from the hottest portions 10C is evacuated, firstly by a first horizontal heat pipe 11 towards the second hot portions 10A. The heat thereof is thus evacuated towards the cooler portions 10B by means of heat the pipe 11, which is sloping. The two heat pipes 11 are serially set.

It is thus possible to promote maintaining the hot portions 10C at a temperature of less than 105° C., as required by present standards. The switchgear may thus be cooled more easily.

The positions of the six heat pipes 11 are shown in the embodiment in the figure. Other heat pipes could be placed in sections other than those shown in FIG. 2, including further down, using certain heat pipe technologies that are provided with internal devices encouraging the return of the liquid phase towards the hot portions by means of capillary forces. This technique may also be adapted for use with other electrical switchgear, such as disconnectors and circuit breakers, but using other operating technologies.

ADVANTAGES OF THE INVENTION

The method and apparatus of the invention make use of tested heat-pipe technology. The heat is taken directly at its source and conveyed towards the outside of the switchgear.

The invention claimed is:

1. A cooling method for cooling medium-voltage, high-current electrical switchgear (10), having hot portions (10A, 10C) a hot portion (10C) of which is hotter than another hot portion (10A) and cooler portions (10B), that are cooler than the hot portions (10A, 10C);

the method being characterized in that it consists in inserting two heat pipes (11) serially inside the switchgear (10), putting a heat pipe (11) between this two hot portions (10A, 10C) in order to evacuate the heat from the hotter (10C) towards the cooler (10A) of the two hot portions, and putting a first end (11A) of another heat pipe in the cooler portion (10A) of these hot portions and a second end (11B) of this other heat pipe (11) in a portion that is cooler (10B) than said hot portions (10A, 10C).

2. A cooling system for cooling medium-voltage, high-current electrical switchgear, having hot portions a hot portion of which is hotter than another hot portion and cooler portions that are cooler than the hot portions;

the system comprising a first heat pipe between these hot portions in order to evacuate heat from the hotter towards the cooler of the two hot portions and another heat pipe, a first end of which is placed in one hot portion and a second end is placed in a portion that is cooler than said hot portions, the two heat pipes being serially set.

* * * * *